United States Patent
Li et al.

(10) Patent No.: US 10,318,365 B2
(45) Date of Patent: Jun. 11, 2019

(54) SELECTIVE ERROR CORRECTING CODE AND MEMORY ACCESS GRANULARITY SWITCHING

(71) Applicant: HEWLETT PACKARD ENTERPRISE DEVELOPMENT LP, Houston, TX (US)

(72) Inventors: Sheng Li, Palo Alto, CA (US); Norman P. Jouppi, Palo Alto, CA (US); Doe Hyun Yoon, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 76 days.

(21) Appl. No.: 14/437,684

(22) PCT Filed: Nov. 2, 2012

(86) PCT No.: PCT/US2012/063421
§ 371 (c)(1),
(2) Date: Apr. 22, 2015

(87) PCT Pub. No.: WO2014/070200
PCT Pub. Date: May 8, 2014

(65) Prior Publication Data
US 2015/0278004 A1    Oct. 1, 2015

(51) Int. Cl.
*G06F 11/00* (2006.01)
*G06F 11/07* (2006.01)
(Continued)

(52) U.S. Cl.
CPC ........ *G06F 11/0787* (2013.01); *G06F 11/073* (2013.01); *G06F 11/1048* (2013.01);
(Continued)

(58) Field of Classification Search
CPC .............. G06F 11/0787; G06F 11/073; G06F 11/1048; G06F 12/0875; G06F 2212/45;
(Continued)

(56) References Cited

U.S. PATENT DOCUMENTS 8,032,688 B2 * 10/2011 MacWilliams ..... G06F 13/1684
365/189.011
8,364,926 B2 * 1/2013 Hampel .............. G06F 13/1684
711/168

(Continued)

FOREIGN PATENT DOCUMENTS

| CN | 1501258 | 6/2004 |
|----|---------|--------|
| CN | 101308462 | 11/2008 |
| KR | 1020100119310 A | 11/2010 |
| TW | 201232258 A1 | 8/2012 |
| TW | 201234170 A1 | 8/2012 |

OTHER PUBLICATIONS

Dictionary definition of cache memory, retrieved from wikipedia: https://en.wikipedia.org/wiki/Cache_memory.*

(Continued)

*Primary Examiner* — Yair Leibovich
(74) *Attorney, Agent, or Firm* — Hewlett Packard Enterprise Patent Department

(57) ABSTRACT

Example methods, systems, and apparatus to provide selective memory error protection and memory access granularity are disclosed herein. An example system includes a memory controller to determine a selected memory mode based on a request. The memory mode indicates that a memory page is to store a corresponding type of error protection information and is to store data for retrieval using a corresponding access granularity. The memory controller is to store the data and the error protection information in the memory page for retrieval using the error protection information and the access granularity.

19 Claims, 6 Drawing Sheets

(51) Int. Cl.

| | | |
|---|---|---|
| *G11C 29/42* | (2006.01) | |
| *G11C 29/02* | (2006.01) | |
| *G11C 29/52* | (2006.01) | |
| *G06F 11/10* | (2006.01) | |
| *G06F 12/0875* | (2016.01) | |
| *G11C 7/20* | (2006.01) | |
| *G11C 29/04* | (2006.01) | |

(52) U.S. Cl.
CPC ........ *G06F 12/0875* (2013.01); *G11C 29/028* (2013.01); *G11C 29/42* (2013.01); *G11C 29/52* (2013.01); *G06F 2212/45* (2013.01); *G11C 7/20* (2013.01); *G11C 2029/0411* (2013.01)

(58) Field of Classification Search
CPC ......... G11C 29/028; G11C 29/08; G11C 7/20; G11C 29/52; G11C 29/42; G11C 2029/0411
USPC ...................................................... 714/6.11
See application file for complete search history.

(56) References Cited

U.S. PATENT DOCUMENTS

| | | | |
|---|---|---|---|
| 2003/0070055 A1 | 4/2003 | Johnson et al. | |
| 2008/0046666 A1 | 2/2008 | Termaine | |
| 2010/0005218 A1* | 1/2010 | Gower | G06F 13/4234 711/5 |
| 2010/0251036 A1 | 9/2010 | Moyer | |
| 2010/0281342 A1 | 11/2010 | Chang et al. | |
| 2011/0078544 A1 | 3/2011 | Gruner et al. | |
| 2011/0239064 A1 | 9/2011 | Byom et al. | |
| 2012/0005415 A1* | 1/2012 | Jung | G06F 12/0246 711/103 |
| 2012/0030540 A1 | 2/2012 | Bacchin et al. | |
| 2012/0066567 A1 | 3/2012 | Moyer | |
| 2013/0036273 A1* | 2/2013 | Shaeffer | G06F 13/16 711/148 |
| 2014/0047452 A1* | 2/2014 | Ceze | G06F 9/5027 718/104 |
| 2014/0059277 A1* | 2/2014 | Chung | G06F 3/0604 711/103 |
| 2014/0304475 A1* | 10/2014 | Ramanujan | G06F 12/0895 711/128 |
| 2015/0006841 A1* | 1/2015 | Chen | G06F 13/4239 711/167 |
| 2015/0082122 A1* | 3/2015 | Udipi | G06F 11/1064 714/764 |

OTHER PUBLICATIONS

Dictionary definition of "Memory Rank", retrieved from wikipedia: https://en.wikipedia.org/wiki/Memory_rank on Feb. 5, 2018.*
Wikipedia "Dynamic random-access memory" page, using way back machine, retrieved from https://en.wikipedia.org/wiki/Dynamic_random-access memory (Year: 2012).*
Wikipedia "Memory rank" page, using way back machine, retrieved from https://en.wikipedia.org/wiki/Memory_rank (Year: 2012).*
PCT Search Report/Written Opinion—Application No. PCT/US2012/063421 dated May 10, 2013—10 pages.
Ahn, J., et al. "Future Scaling of Processor-Memory Interfaces." High Performance Computing Networking, Storage and Analysis, Proceedings of the Conference on. IEEE, 2009, 13 pages.
AMD, "BIOS and Kernel Developer's Guide for AMD NPT Family 0Fh Processors", Technical Report, Advanced Micro Devices, Inc , Publication No. 32559, Revision 3.16, Nov. 2009, 446 pages.
Dell, T. J. "A White Paper on the Benefits of Chipkill—Correct ECC for PC Server Main Memory." IBM Microelectronics Division (1997): 1-23.
Dong, X, et al. "Leveraging 3D PCRAM Technologies to Reduce Checkpoint Overhead for Future Exascale Systems.", Proceedings of the Conference on High Performance Computing Networking, Storage and Analysis. ACM, 2009, 12 pages.
Intel, "Intel Itanium Architecture Software Developer's Manual Revision 2.3", May 2010, 420 pages, vol. 3, Revision 2.3, Intel Corporation.
Kogge, P., et al. "Exascale Computing Study: Technology Challenges in Achieving Exascale Systems." (2008), 297 pages.
L.I. S., et al. "System Implications of Memory Reliability in Exascale Computing." Proceedings of 2011 International Conference for High Performance Computing, Networking, Storage and Analysis. ACM, 2011, 13 pages.
Liptay, J. "Structural Aspects of the System/360 Model 85, II: The Cache." IBM Systems Journal 7.1 (1968): 15-21.
Mutlu, O., and Moscibroda, T , "Parallelism-Aware Batch Scheduling: Enhancing Both Performance and Fairness of Shared DRAM Systems." ACM SIGARCH Computer Architecture News. vol. 36. No. 3. IEEE Computer Society, 2008, 12 pages.
Wilkerson, C., et al. "Reducing Cache Power With Low-Cost, Multi-Bit Error-Correcting Codes." ACM SIGARCH Computer Architecture News 38.3 (2010): 83-93.
Woo, Dong Hyuk, et al. "An optimized 3D-stacked memory architecture by expioiting excessive, high-density TSV bandwidth." High Performance Computer Architecture (HPCA), 2010, 12 pages.
Yoon, D and Erez, M., "Virtualized and Flexible ECC for Main Memory." ACM SIGARCH Computer Architecture News. vol. 38. No. 1. ACM, 2010, 12 pages.
Yoon, D., et al. "FREE-P: Protecting Non-Volatile Merrioty Against Both Hard and Soft Errors." High Performance Computer Architecture (HPCA), 2011 IEEE 17th International Symposium on. IEEE, 2011, 12 pages.
Yoon, D., et al., "Adaptive Granularity Memory Systems: A Tradeoff Between Storage Efficiency and Throughput." ACM SIGARCH Computer Architecture News 39.3 (2011): 295-306.
Partial supplementary European search report dated Jan. 26, 2017 for EP application No. 12887804.8; pp. 7.

* cited by examiner

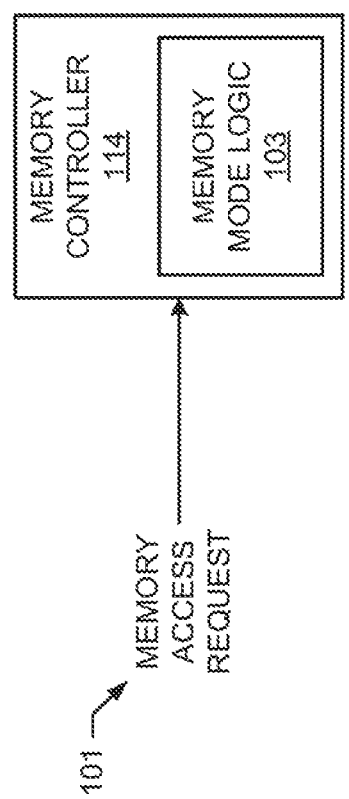

SELECTIVE ERROR CORRECTING CODE AND MEMORY ACCESS GRANULARITY SWITCHING

BACKGROUND

Computer memories are vulnerable to errors. To mitigate such memory errors, robust memory error protection systems may be employed that enable memory errors to be detected and/or corrected using various error correcting codes (ECC). Many memory error protection systems result in increased bandwidth and power overhead due to the significant data fetched (e.g., overfetched) for memory transactions. Such a memory error protection system may employ, for example, chipkill-ECC, which enables two memory chip failures to be detected and one memory chip failure to be corrected. Such a memory error protection system may require 128 bytes of data to be fetched for each 64-byte memory transaction, resulting in overfetching of half the data and waste of bandwidth and/or power overhead.

Different applications may prefer different types of access granularities to be employed in computer memory systems. Access granularity refers to the amount of data that is accessed during a single memory access operation at a memory system. A multithreaded application may, for example, prefer a smaller access granularity that provides less use of data locality while a sequential or single threaded application may favor a larger access granularity that provides higher use of data locality. In some examples, a larger access granularity may be preferred for applications with increased dirty data as the data may be written back immediately from, for example, the application, when the cache line with the dirty data is evicted.

BRIEF DESCRIPTION OF THE DRAWINGS

FIG. 1A depicts an example memory controller implemented in accordance with the teachings disclosed herein.

DETAILED DESCRIPTION

Figure 1B:
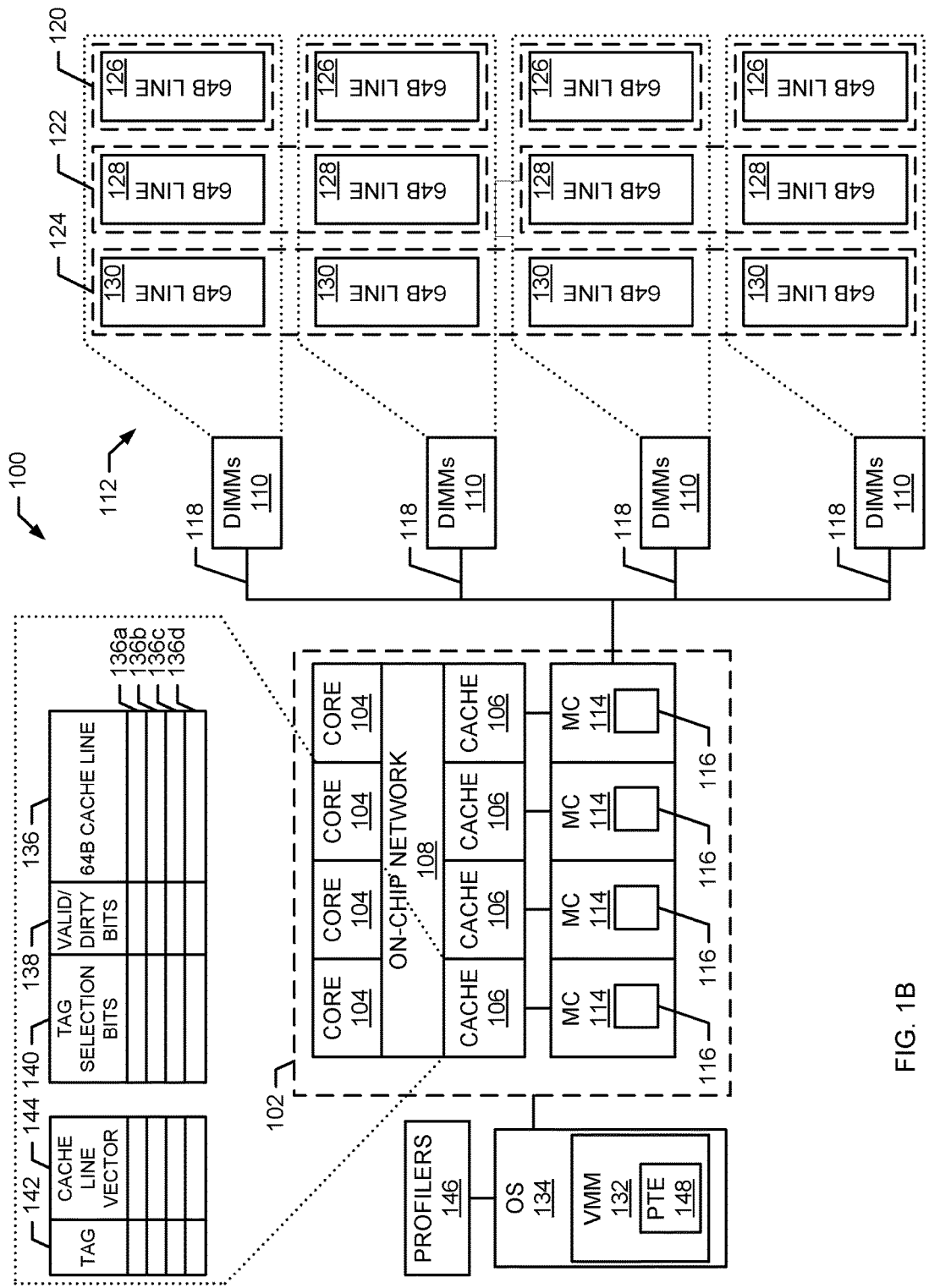
FIG. 1B is an example system that uses the example memory controller of FIG. 1A to provide selective granularity access and selective memory protection for memory systems.

Providing strong error protection in memory systems generally requires a wide memory channel that uses a large access granularity (e.g., a large amount of data to be retrieved for a single memory access operation) and, thus, a large cache line. Some applications that access data having relatively low spatial locality waste memory power and bandwidth when a large access granularity is used because much of the retrieved data is not relevant and/or not used by a requesting operation. As used herein, data that has low spatial locality is data that is not contiguously stored in physical memory or stored within relatively close memory locations such that a single read access can retrieve multiple data of interest.

Example systems and methods disclosed herein may be used to implement memory systems with selective granularity and selective error protection. By selecting different memory error protection techniques (e.g., ECC techniques) and different access granularities based on application behaviors and/or system memory utilization, example systems and methods disclosed herein may be used to increase system performance, power efficiency, energy efficiency, and/or reliability in memory systems. Systems and methods disclosed herein may be implemented with relatively few modifications to conventional hardware and operating systems and, thus, is scalable and may be implemented with existing servers and/or data centers.

Example systems and methods disclosed herein enable different memory modes to be implemented in a memory system. Example techniques disclosed herein for selectively implementing different memory modes may be used to combine larger memory access granularities with stronger memory error protection techniques and smaller memory access granularities with less strong, but more efficient, memory error protection techniques. Such disclosed techniques for selectively implementing different memory modes increase performance and/or efficiency of memory systems over prior memory systems.

Example memory controllers disclosed herein manage the layout of data in memory, manage the scheduling of memory accesses, and manage memory channel integration. Example systems and methods disclosed herein provide a cache to manage data with mixed access granularities. Example systems and methods disclosed herein enable selection of different memory access granularities on a per-memory page basis and/or on a per-application basis. Examples disclosed herein also enable managing multiple memory access granularities concurrently implemented across different regions of physical memory.

Example apparatus to provide selective memory error protection and selective memory access granularity include a memory controller to determine a selected memory mode based on a request. The memory mode indicates that a memory page is to store a corresponding type of error protection information and is to store data for retrieval using a corresponding access granularity. In some such examples, the memory controller is to store the data and the error protection information in the memory page for retrieval using the access granularity.

Example systems disclosed herein to provide selective memory error protection and memory access granularity include a memory manager to determine a selected memory mode based on a request. In some examples, the memory mode indicates that a memory page is to store a corresponding type of error protection information and is to store data for retrieval using a corresponding access granularity. In some examples, the system includes a memory controller to store the data and the error protection information in the memory page for retrieval using the corresponding access granularity. In some examples, the system includes a cache including a plurality of cache lines to store portions of the data of the memory page based on the corresponding access granularity.

Example methods disclosed herein to provide selective memory error protection and selective memory access granularity include determining a selected memory mode based on a request to access data in memory. In some examples, the memory mode indicates that a memory page is to store a corresponding type of error protection information and is to be accessed using a corresponding access granularity. In some examples, the example method includes writing the corresponding type of error protection information and data to the memory page using a channel data width corresponding to the corresponding access granularity.

The Joint Electron Devices Engineering Council (JEDEC) double data rate synchronous dynamic random-access memory (DDRx SDRAM) is a widely used standard in DRAM architectures. For JEDEC standard DRAM, a memory controller controls physical memory via one or more memory channels. DDRx DRAM chips transfer a particular number of data bits at a time, for example, 4, 8, 16, etc. This may be referred to as the DRAM chip width. In some systems, each memory channel provides a data bus having a width of 64 bits (e.g., data may be transferred 64 bits at a time).

For a 64-bit memory channel data bus, a rank composed of x8 DRAM chips (e.g., a DRAM chip that transfers 8 bits of data at a time) requires 8 DRAM chips to work together to output an entire 64-bit word. In some systems, the physical memory is implemented using multiple dual in-line memory modules (DIMMs). Each DIMM generally includes or more ranks. A rank is the smallest set of DRAM chips that may be used together for a read and/or write operation. In some examples, a rank is logically partitioned into 4 to 16 banks, with each bank having the same word size. The ranks corresponding to a memory channel may process memory operations concurrently to increase memory parallelism. In some examples, all banks within a rank can be accessed concurrently (e.g., may operate in parallel) and data may be interleaved on the memory channel data bus to increase memory parallelism. Interleaving refers to a manner of arranging data in a non-contiguous manner in a memory array by storing different portions of the data across multiple banks or chips of the memory array so that when the multiple banks or chips are accessed simultaneously on the memory channel, the different associated portions of the data can be retrieved simultaneously from across the different banks or chips of the memory array to improve memory performance and memory error protection. In some examples, multiple memory channels associated with a memory controller may work together in a lock-step manner to act as a single logical memory channel to provide a wider memory data bus (e.g., 128 bits, etc.) for a single read and/or write operation.

In some examples, a memory read and/or write (e.g., issued by a processor) may request an entire cache line of 64B to be transferred. The cache line may be mapped to different DRAM chips within a rank. In such examples, all the DRAM chips in a rank contribute to the entire cache line during the read and/or write operation. In some examples, read and/or write operations are performed in a burst mode so as to transfer the entire cache line. For example, for a 64-bit memory channel, a burst length of 6 can transfer an entire 646 cache line using a single burst operation.

In regard to memory error protection, to protect data in memory from errors, some example systems implement memory protection using memory modules (e.g., DIMMs) having error correcting code (ECC) capabilities (e.g., an ECC DIMM). An ECC DIMM has a relatively larger storage capacity than non-ECC DIMMs for storing ECC information in addition to data. In some examples, to transfer ECCs, the memory channel data bus for an ECC DIMM is 72 bits wide including 64 bits for data and 8 bits for an ECC (e.g., data may be transferred 64 bits at a time with simultaneous transfers of 8-bit ECCs). A memory controller associated with an ECC DIMM encodes and/or decodes ECCs for the ECC DIMM on each read and/or write operation to detect and/or correct errors.

There are different types of ECCs. A single bit-error correction and double-bit error detection (SECDED) ECC is an 8-bit code used with 64-bits of data (e.g., the data width of a standard DIMM) and can tolerate (e.g., correct) a 1-bit error. Some errors may exceed the tolerance of SECDED, such as global circuit failure and complete chip failure. Chipkill-correct is a type of memory ECC that provides stronger error protection (e.g., stronger than SECDED).

Chipkill-correct tolerates (e.g., corrects) a chip failure and can detect up to two chip failures. Thus, memory systems implementing chipkill-correct may continue to operate even when a DRAM chip failure occurs. Memory protection using chipkill-correct provides a stronger reliability relative to SECDED. Chipkill-correct may be implemented in a memory system by interleaving bit-error-correcting ECCs. For example, chipkill-correct for a x4 DRAM may be implemented using four interleaved SECDED codes. In such an example, each data pin of a DRAM chip is used for a different SECDED code. Thus, a DRAM chip failure appears as a 1-bit error in each SECDED code. To implement such an interleaved SECDED design, a memory channel on a 256-bit wide data bus is used, in some examples.

Some memory systems that implement chipkill-correct may use a symbol-based Reed-Solomon (RS) code with a single symbol-error correction and double symbol-error detection (SSCDSD) capability. For chipkill-correct memory protection, a b-bit symbol is constructed from b bits of data out of a DRAM chip so that a chip failure manifests as a symbol error. In some examples, a four-ECC-symbol RS code provides the SSCDSD capability with 4-bit symbols. In such an example, the code has 128 bits of data and 16 bits of ECC. Memory systems may use this code to implement chipkill-correct for x4 DRAM. In a x8 DRAM system, an SSCDSD RS code has a higher overhead. Thus, some memory systems implementing chipkill-correct use x4 DRAM.

ECC schemes may be implemented based an DRAM chip width and the number of memory channels used. For example, a x4 DRAM chip may provide strong memory protection with high bit efficiency. A x4 ECC DIMM has two ECC DRAM chips that may implement chipkill-correct with a 64-bit wide memory channel, which enables a small access granularity of 64B (64 bits×a burst of 8=64B). A 128-bit wide memory channel, which provides a medium access granularity of 128B, with two x4 ECC DIMMS in parallel may implement double chipkill-correct. A 256-bit wide memory channel, which provides a large access granularity of 256B, may implement quad chipkill-correct. For a x8 DRAM chip, SECDED is implemented using a 64-bit wide memory channel with an access granularity of 64B, chipkill-correct is implemented using a 128-bit wide memory channel with an access granularity of 128B, and double chipkill-correct is implemented using a 256-bit wide memory channel with an access granularity of 256B. For a x16 DRAM chip, SECDED is implemented using a 64-bit wide memory channel with an access granularity of 64B, DEC (double-bit error correcting code) is implemented using a 128-bit wide memory channel with an access granularity of 128B, and chipkill is implemented using a 256-bit memory channel with an access granularity of 256B.

Different ECC schemes (e.g., SECDED, chipkill, etc.) may provide different levels of protection for memory systems. For example, ECC schemes with large access granularity at a memory interface can provide stronger memory protection. However, stronger memory protection may require more overhead. For example, strong memory protection may require a wide memory bus and, thus, multiple memory channels may have to work in a lock-step manner to provide the wide memory bus. In some examples, if the access granularity at the processor side (e.g., the cache line size) does not match the access granularity at the memory subsystem side, significant performance and energy penalties may occur. In some examples, chipkill in a x8 DRAM uses two memory channels in lock-step mode, increasing a memory access granularity to 128B. In such examples, if a processor uses 64B cache lines, the memory controller must read twice as much data as the processor requests and then discard half the data after the memory controller computes ECC, wasting power and bandwidth. Generally, a strong memory protection mechanism with wider DRAM chips uses a large access granularity and may introduce a granularity mismatch. In prior systems that match the granularities at the processor side (e.g., by using large cache lines) and the memory side to a same fixed access granularity may not save memory bandwidth and/or power from being wasted because different applications favor different access granularities. Prior systems that match the access granularities at the processor and the memory at a fixed granularity may increase bandwidth and/or waste power if data locality is different between different applications such that a fixed access granularity creates disparate performance results across the different applications by, for example, overfetching or underfetching data at the processor.

In some example systems and methods disclosed herein, choosing an access granularity (e.g., an optimal access granularity) is application dependent. For example, an application with low spatial locality is implemented with a smaller access granularity while an application with a higher spatial locality (e.g., associated data that is usually used together is stored in physically close memory cell proximity to one another in a memory so that they can be retrieved simultaneously using a single row buffer access or channel access) is implemented with a larger access granularity. Example systems and methods disclosed herein provide a memory architecture having selectable access granularities for different applications that exploit data locality characteristics of the applications and improve overall system performance. In addition, example systems and methods disclosed herein provide increased memory protection to applications that are preferably implemented with higher granularity.

Example systems and methods disclosed herein provide selectable memory modes ranging between large-granularity memory access with strong memory protection and small-granularity memory access with less strong, but more efficient, memory protection. In example systems and methods disclosed herein, memory modes are used to define different combinations of memory access granuiarities and memory protection techniques (e.g., ECC techniques). Example systems and methods disclosed herein determine a memory mode for each application to provide high-resiliency, high-throughput, and power-efficient memory systems. In particular, example systems and methods disclosed herein can provide strong memory protection with little (e.g., minimal) performance overhead and power efficiency. Example systems and methods disclosed herein may be used in connection with different modern applications having different memory behaviors.

FIG. 1A illustrates an example memory controller (MC) 114 that may be used to provide selective granularity access and memory protection for memory systems. In the illustrated example, the memory controller 114 determines a selected memory mode based on a memory access request 101. The selected memory mode indicates that a memory page is to store a type of error protection information corresponding to the selected memory mode and is to store data for retrieval using an access granularity corresponding to the memory mode. The memory controller 114 uses the memory mode logic 103 to store data and the error protection information in the memory page for retrieval using the access granularity.

FIG. 1B is an example system 100 that may use the memory controller (MC) 114 of FIG. 1A to provide selective granularity access and selective memory protection for memory systems. The example system 100 enables selections of different access granularities and different memory error protection schemes for particular applications with particular memory behaviors. The example system 100 allows an operating system 134, hardware, an application, a user, or a combination thereof to select a memory mode including a memory error protection scheme and/or an access granularity for a particular application. Selecting a particular memory mode including a particular memory error protection scheme and/or an access granularity for a particular application as disclosed herein increases performance, power efficiency, and/or memory bandwidth utilization while maintaining system reliability.

In the illustrated example of FIG. 1B, the example system 100 includes a multi-core processor 102 that includes multiple processing cores 104 in communication with corresponding caches 106 (e.g., last level caches (LLCs)) via an on-chip network 108. The multi-core processor 102 of the illustrated example includes multiple ones of the memory controller 114 of FIG. 1A. In the illustrated example, to access (e.g., read and/or write) data in one or more memory device(s) 112, each of the last level cache banks 106 is in communication with a corresponding memory controller 114. In the illustrated example, the last level cache banks 106 locally cache frequently accessed data in the multi-core processor 102 for retrieval by threads executed by the cores 104. When data requested by a thread is not available in a corresponding last level cache bank 106 and/or when a thread requests that data be written to the memory 112, a corresponding memory controller 114 accesses memory locations in the memory 112 to accomplish such data reads and/or writes.

In the Illustrated example, to protect data from errors, the memory 112 is implemented using error correcting code (ECC) DIMMs (e.g., the DIMMs 110). The ECC DIMMs 110 have a larger storage capacity than non-ECC DIMMs for storing data memory error protection information (e.g., ECCs) in addition to data. Each memory channel 118 associated with corresponding DIMMs 110 provides a 72-bit wide bus including 64-bits for data and 8-bits for memory error protection (e.g., ECCs). The memory controllers 114 decode and/or encode ECCs for the ECC DIMMs 110 for read and/or write operations via the memory channels 118 to detect and/or correct errors. There are different types of memory ECCs that may be used to protect data from errors. For example, the memory controllers 114 may implement SECDED, chipkill, SSCDSD, etc. for use with the ECC DIMMs 110.

In the illustrated example, the system 100 is configured to select between different memory, modes that provide different levels of protection ranging from stronger error protection with a larger access granularity (e.g., more data is accessed during a single memory access operation) to less strong error protection with a smaller access granularity (e.g., less data is accessed during a single memory access operation). In the illustrated examples, the system 100 can select between three memory modes for the memory 112 constructed with DRAM devices with different chip widths (e.g., x4, x8, or x16 DRAM devices). The memory controllers 114 have ECC logic (e.g., a fine-grained mode logic 204, a medium-grained mode logic 206, and a coarse-grained mode logic of FIG. 2) for the different memory modes selectable in the system 100 (e.g., SECDED, chipkill, double chipkill, quad chipkill, etc.). The memory controllers 114 of the illustrated example have access to the multiple memory channels (e.g., each of the memory channels 118) and control each of the memory channels 118 independently and/or simultaneously based on the memory mode to be implemented.

The illustrated example of FIG. 1B shows different access granularities 120, 122, and 124 that may be used in the example system 100 as different memory modes specifying memory access granularities and error protection types. In the illustrated example, a fine-grained mode 120 uses the memory channels 118 independently as separate 64-bit wide logical channels, enabling a 64B memory access 126. In the illustrated example, the fine-grained mode 120 uses chipkill-correct for a x4 DRAM system and SECDED for x8 and x16 DRAM systems. A medium-grained mode 122 of the illustrated example uses two memory channels 118 in a lock-step mode to form a 128-bit wide memory channel, enabling a 128B memory access 128. In the illustrated example, the medium-grained mode 122 uses double chipkill for x4 DRAM systems, chipkill for x8 DRAM systems, and DEC for x16 DRAM systems. The memory protection in the medium-grained mode 122 is stronger than that provided by the fine-grained mode 120 due to the larger access granularity of the medium-grained mode 122. A coarse-grained mode 124 uses four memory channels 118 in a lock-step mode to form a 256-bit wide memory channel, enabling a 2566 memory access 130. In the illustrated example, the coarse-grained mode 124 uses quad chipkill for x4 DRAM systems, double chipkill for x8 DRAM systems, and chipkill for x16 DRAM systems. The memory protection in the coarse-grained mode 124 is stronger than that provided by the fine-grained mode 120 and the medium-grained mode 122 due to the larger access granularity.

Figure 2:
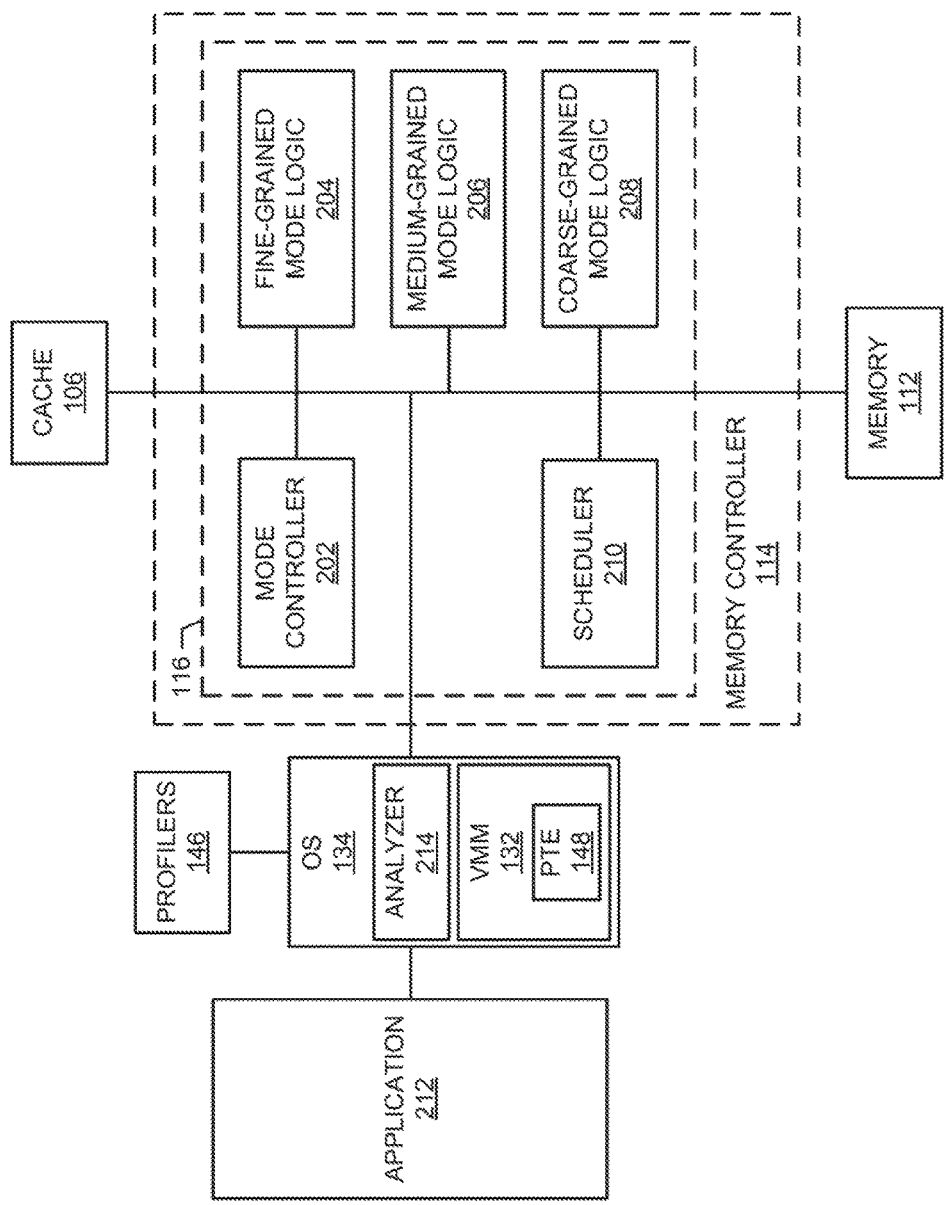
FIG. 2 depicts an example apparatus that may be used in connection with the example memory controller of FIGS. 1A and 1B to provide selective access granularity and selective memory error protection.

In the illustrated example, when implementing the fine-grained memory mode 120, a corresponding memory controller 114 controls the memory channels 118 independently, and when implementing the medium-grained or coarse-grained memory modes 124, the memory controller 114 controls multiple ones of the memory channels 118 simultaneously. The memory channels 118 are provided with respective apparatus 116 to manage memory channels, memory protection, data layout, and/or memory scheduling. An example detailed illustration of the apparatus 116 is shown in FIG. 2. The three memory modes 120, 122, and 124 are shown in the illustrated example; however, any other memory mode may additionally or alternatively be implemented in the system 100. For example, larger access granularities with stronger memory protection could be implemented. Furthermore, fewer or more memory modes may be used in the system 100.

To implement the different memory modes, the example system 100 maintains a data layout in the memory 112 that is compatible with the different memory modes to reduce mode switching overhead. In the illustrated example, when three memory modes are implemented in the example system 100 (e.g., a 64B fine-grained mode, a 128B medium-grained mode, and a 256B coarse-grained mode), data is interleaved at the 256B boundary across all of the memory controllers 114, then the 64B data blocks are interleaved across all four 64-bit physical channels within the same memory controller 114. As data is interleaved in a similar manner when each of the memory modes is implemented, the data layout between the memory modes is not changed. If a memory mode is changed between a fine-grained mode and a coarse-grained mode, the data layout remains the same while only the ECC bits are re-generated and replaced.

The example apparatus 116 of the memory controllers 114 of the illustrated example control the scheduling of memory requests associated with different granularities. In some examples, memory requests include a request to read from a memory page or a request to write to a memory page. In some instances, scheduling memory requests with different granularities creates scheduling challenges when, for example, a coarse-grained request uses multiple memory channels 118 in a lock-step manner to provide a larger access granularity. Coarse-grained requests may be scheduled only when multiple memory channels 118 are available at the same time. In some instances, a memory channel 118 may not be available for a coarse-grained request when the memory channel 118 is being used for a fine-grained request. As a coarse-grained request uses multiple memory channels 118, the coarse-grained request may be deferred for a relatively long duration when multiple fine-grained requests are received. In some examples, servicing coarse-grained requests only after all fine-grained requests are serviced results in relatively lower system performance than desirable because retrieval of data corresponding to the coarse-grained request may be delayed for a significantly long duration. To avoid or overcome such undesirably low performance, the apparatus 116 enables coarse-grained requests to be serviced in a more timely fashion by prioritizing coarse-grained requests as higher priority when they have been deferred due to fine-grained requests. When the apparatus 116 of the memory controllers 114 detect a deferment of a coarse-grained request, the priority of the coarse-grained request is raised so that fine-grained requests with a normal priority are not scheduled until the coarse-grained request with the raised priority is serviced. In some examples, the apparatus 116 determines when to increase the priority of a coarse-grained request based on how long the coarse-grained request has been pending without being serviced. For example, the apparatus 116 may increase the priority of a coarse-grained request if the request is not serviced within a threshold period of time (e.g., a timeout). In this manner, coarse-grained requests do not block fine-grained requests from being serviced.

In the illustrated example, an example virtual memory manager (VMM) 132 (shown within an operating system (OS) 134) manages memory pages having different access granularities and ECC schemes. The virtual memory manager 132 of the illustrated example manages memory mode information for each physical memory page (e.g., memory pages stored in the memory 112) and propagates the memory mode information to the memory controllers 114. For example, the virtual memory manager 132 may specify a type of memory mode (e.g., a fine-grained mode or a coarse-grained mode) to be implemented at the memory 112 and a type of ECC (e.g., chipkill, SECDED, etc.) to be implemented at the memory 112 in that particular memory mode. The virtual memory manager 132 may specify the memory mode to be implemented at the memory mode 112 based on requests from applications and/or based on a determination made by the operating system 134. In the illustrated example, the virtual memory manager 132 enables applications or software to specify particular memory modes to be implemented for particular memory pages stored in the memory 112 (e.g., a request received from an application specifies a particular memory mode). In the illustrated example of FIG. 1B, to propagate the memory mode information (e.g., the memory mode specified by an application) for a particular memory page to the memory controllers 114, a page table entry (PIE) 148 associated with the memory page is augmented by the virtual memory manager 132 to include the particular memory mode. In the illustrated example, the page table entry 148 and the memory mode information is stored in memory 112 and cached in a translation lookaside buffer (TLB) (not shown) to enable applications (e.g., the application 212 of FIG. 2) to relatively quickly access the page table entry 148. In this manner, memory access requests may be handled using the TLB for memory pages with associated page table entries (e.g., the page table entry 148). If a TLB miss occurs (e.g., requested data is not stored in the TLB), memory access requests and the mode information are loaded or retrieved from the page tables (e.g., the page table 148) and stored in the TLB. In the illustrated example, the mode information is then propagated to the memory controller 114 to access memory 112. The page table entry 148 is propagated through the cache hierarchy (e.g., including the TLB and caches 106) to the memory controllers 114 so that the memory controllers 114 may implement the corresponding EGG logic and access granularity for the memory page stored at the memory 112.

Selection of memory modes may be done statically (e.g., at the time of compiling the operating system 134 or an application) or dynamically (e.g., during execution of a runtime environment of the operating system 134 and/or an application). In some examples when the selection is performed statically, a programmer or an auto-tuner (of a compiler) may specify a particular memory mode and/or provide memory mode information (e.g., a particular EGG and/or a particular access granularity) using annotations, hints, compiler pragmas, and/or default modes. For example, a programmer may declare a particular access granularity when memory is allocated based on a memory access pattern. In some examples, a programmer embeds directives into programs to declare the particular memory mode for particular data or memory allocations. During compilation, a compiler generates tags for the particular data and/or memory allocations to denote the particular memory mode. The compiler may also generate the tags by analyzing source code of a program associated with the data during compilation. When the operating system 134 manages the particular data, the operating system 134 assigns the memory mode to the memory pages with the data based on the tags. In some examples, a programmer may specify stronger memory error protection associated with a large access granularity for use with memory pages storing critical data, and less strong, but more efficient, memory error protection associated with a small access granularity for memory pages storing less-critical data (e.g., temporary data that can be easily reconstructed from another source). In some examples, the virtual memory manager 132 and/or the operating system 134 allocate memory pages using a particular memory mode based on the particular access granularity and/or particular ECC specified by a programmer, an application, and/or the operating system 134. In some examples, if a particular ECC is not selected by the programmer, the system 100 (e.g., the operating system 134 and/or the virtual memory manager 132) selects strong memory error protection for large access granularities and selects less strong, but more efficient, memory error protection for smaller access granularities.

Selections of memory modes may also be changed (e.g., memory modes may be switched between fine-grained modes and coarse-grained modes). To determine when the system 100 would benefit from changing a selection of a memory mode, profilers 146 may collect spatial locality information, memory channel and cache usage data, memory failure rates, row-buffer hit rates, etc. from the caches 106 and memory controllers 114. In the illustrated example, the profilers 146 may be implemented using hardware, software, or a combination of hardware and software. Also, although the profilers 146 are shown outside of the processor 102 in the illustrated example, the profilers 146 may be implemented in the processor 102 or some portions of the profilers 146 may be implemented in the processor 102 and other portions of the profilers 146 may be implemented outside of the processor 102. In some examples, data collected by the profilers 146 is stored in a cache or a cache-like structure. The operating system 134 may from time to time evaluate the collected data from the profilers 146 to determine that a different memory mode should be used. For example, the operating system 134 may evaluate the data usage of the application. In such examples, if most data usage has low spatial locality (e.g., associated data is stored across different 64 byte portions of the memory 112), then the operating system 134 may determine that a fine-grained memory mode with a 64B cache line may be used. Alternatively, if most of the data usage has high spatial locality (e.g., associated data is stored continuously within a particular 64 byte portion of the memory 112), then a medium-grained memory mode with a 128B cache line may be used or a coarse-grained memory mode with a 256B cache line may be used. In some examples, the operating system 134 also analyzes the memory bandwidth and elects not to use a coarse-grained memory e where memory bandwidth utilization is high (e.g., availability is low).

In monitoring spatial locality at the caches 106, a cache line (e.g., cache line 136a) may include a flag to indicate that the cache line has been accessed since the time that it was stored in cache. For example, a flag may be set to "1" when the cache line has been accessed and the flag may be set to "0" when the cache line has not been accessed. When a cache line is evicted, the flag information may be sent to the profilers 146 for analysis. A profiler 146 may also use an address space identifier (ASID) included for each cache line to analyze spatial locality of a particular application.

In some examples, the operating system 134 evaluates different results (e.g., access granularity during a last time period, memory bandwidth used during the last time period, mode switching overhead, etc.) collected from the profilers 146 and assigns weights to the different results to determine whether a memory mode should be switched and/or what memory mode is to be implemented. For example, mode switching overhead may weigh more heavily in the determination of whether to switch the memory mode than memory bandwidth use. In some examples, the operating system 134 does not analyze results collected from the profilers 146 when the results are associated with data that has been evicted. The operating system 134 may reserve a first in, first out (FIFO) in memory 112 so that evicted items may be written to the FIFO. The operating system 134 may scan the FIFO region to gather spilled over information in addition to spatial locality information stored in the cache-like structure.

Switching between different memory modes is useful for applications for which memory pages change patterns and, thus, access granularity preferences, during execution. When switching memory modes, a specific memory page may be unavailable until the switch is complete (e.g., until the ECC is reconstructed according to the newly selected memory mode).

In determining whether to switch between memory modes, the operating system 134 may also consider the cost of switching to a different memory mode, because switching the access granularity and ECC in the memory 112 requires ECC reconstruction, which requires a large amount of data to be moved or reorganized. The cost of switching to a different memory mode may be relatively low when, for example, the memory system 100 is idle and power consumption is less of a concern. When the memory system 100 is not idle and/or power consumption is more of a concern for the system 100, switching to a different memory mode may occur during a memory event such as during a page migration or during system checkpointing. During such memory events, switching to a different memory mode incurs relatively little overhead for reconstructing the ECC because of the reading and/or writing of data in the memory 112 that is already occurring as part of such memory events. When the operating system 134 decides to switch the memory mode, the operating system 134 may wait for such a memory event (e.g., a page migration or system checkpointing) to occur. If such a memory event does not occur within a threshold period of time (e.g., a time interval or epoch), the switching of the memory mode may be deferred, and a new determination of whether to switch the memory mode may be made based on newly collected data by the profilers 146. Switching the memory mode does not require processor core 104 intervention once the mode switch is started.

The caches 106 of the illustrated example implement a multi-granularity cache hierarchy to match the different access granularities for accessing the memory 112 based on the selected memory modes. For example, the caches 106 of the illustrated example enable 64B of data to be cached for the fine-grained mode, 128B of data to be cached for the medium-grained mode, and 256B of data to be cached for the coarse-grained mode. A detailed view of one of the caches 106 shows cache lines 136 (e.g., 64B of data) associated with corresponding valid and/or dirty bits 138 to indicate if the corresponding cache lines contain valid data or dirty data. A cache line 136 may be marked dirty if its data has been changed (e.g., the data is different from the data stored at the memory 112). Setting a dirty bit 138 means that corresponding data is to be written through to the memory 112 (e.g., when the cache line 136 is to be evicted).

In the illustrated example, the internal bus width of the caches 106 is provisioned based on the smallest access granularity of the memory modes (e.g., 64B). The width remains the same for different access granularities associated with different memory modes. When the caches 106 receive 128B-wide data or wider data (e.g., when medium or coarse-grained modes are implemented), the caches 106 allocate two or more cache lines 136 to a same set of cache lines and the co-allocated cache lines 136 are assigned a shared tag. For example, where a coarse-grained mode is implemented in the system 100, cache line 136a, cache line 136b, cache line 136c, and cache line 136d are allocated together and a single tag value (e.g., "1") is shared across all cache lines 136a-136d. The assigned tag is stored as tag selection bits 140. In the illustrated example, because the cache lines 136a-136d share a tag value, they are combined to form a cache sector.

In the illustrated example, the assigned tag is also stored at a tag entry 142. In the illustrated example, a cache line vector 144 acts as a pointer and is associated with the tag entry 142 to point to the corresponding cache lines 136 assigned to the tag entry 142 (e.g., cache lines 136a-136d). The cache lines 136 pointed to by the cache line vector 144 are logical sub-cache lines (e.g., 64B of data) within a larger cache line (e.g., 256B of data), In the illustrated example, the cores 104 and/or the memory controllers 114 use the tag selection bits 140 to identify tags 142 of corresponding cache lines 136. Such identification is useful when for example, a cache line (e.g., a larger cache lines such as 256B) is to be evicted. In such an example, the cache line 136b may have a tag value of "1" at its corresponding tag selection bits 140. In the illustrated example, the tag value "1" is at a corresponding tag entry 142 to identify cache lines 136a, 136c, and 136d via a corresponding cache line vector 144. Once the cache lines 136a, 136c, and 136d are identified as associated with cache line 136b, all of the cache lines 136a-136d may be evicted.

FIG. 2 depicts an example apparatus 116 that may be, used in connection with the example memory controllers 114 of FIGS. 1A and 1B and the example system 100 of FIG. 1B to provide selective memory access granularity and selective memory error protection types. The example apparatus 116 of the illustrated example is implemented in a memory controller 114 of FIGS. 1A and 1B. In the illustrated example of FIG. 2, the example apparatus 116 includes an example mode controller 202, example fine-grained mode logic 204, example medium-grained mode logic 206, example coarse-grained mode logic 208, and an example scheduler 210. The example fine-grained mode logic 204, example medium-grained mode logic 206, and example coarse-grained mode logic 208 of the illustrated example correspond to the memory mode logic 103 of FIG. 1A.

The virtual memory manager 132 (FIG. 1B) of the operating system 134 (FIG. 1B) of the illustrated example receives operation requests. Operation requests include, for example, requests to read data from and/or write data to the cache 106 and/or the memory 112 of FIG. 1. In the illustrated example, the virtual memory manager 132 receives operation requests from an application 212 and/or the operating system 134. In some examples, operation requests specify a preferred or particular memory mode. The memory modes include a fine-grained mode (e.g., the fine-grained mode 120 of FIG. 1B), a medium-grained mode (e.g., the medium-grained mode 122 of FIG. 1B), and a coarse-grained mode (e.g., the coarse-grained mode 124 of FIG. 1B). The fine-grained mode provides a smaller access granularity with less strong, but more efficient, ECC protection. The medium-grained mode provides a medium access granularity with stronger ECC protection relative to the protection provided by the fine-grained mode. The coarse-grained mode provides a larger access granularity with stronger ECC protection relative to the fine and medium-grained modes. In some examples, the application 212 may select the particular memory mode based on the memory mode that will provide an acceptable balance between performance and access granularity and memory error protection. For example, if the application 212 has low spatial locality, the application 212 may select the fine-grained mode because it provides a smaller access granularity, and specifies the selection of the fine-grained mode in the operation request (e.g., a request to write to a memory page). If, for example, the application has high spatial locality, the application 212 selects the coarse-grained mode because it provides a larger access granularity, and specifies the selection of the coarse-grained mode in the operation request. The virtual memory manager 132 of the illustrated example communicates the memory mode identified by the application 212 and/or the operating system 134 to the apparatus 116 of the memory controller 114 via the page table entry 148 (FIG. 1B). The page table entry 148 is augmented to include the particular selected memory mode for a particular memory page to propagate the particular memory mode to the mode controller 202 of the illustrated example so that the mode controller 202 may implement the corresponding ECC logic and access granularity for the memory page.

The mode controller 202 of the illustrated example implements the particular ECC technique and particular access granularity associated with the memory mode identified in the page table entry 148 at the memory 112 (FIG. 1B) using the corresponding fine-grained mode logic 204, the medium-grained mode logic 206, or the coarse-grained mode logic 208. If the operation request received at the virtual memory manager 132 from the application 212 specifies a selection of the fine-grained mode, the mode controller 202 uses the fine-grained mode logic 204 to implement a corresponding ECC and access granularity (e.g., to read and/or write to memory 112 using an error protection type and access granularity corresponding to the fine-grained mode). The fine-grained mode logic 204 of the illustrated example is provided with logic circuits to use each memory channel as a separate 64-bit wide logical channel to enable a 64B memory access 126 (FIG. 1B). The fine-grained mode logic 204 of the illustrated example is also provided with logic to implement a chipkill-correct type of error protection for a x4 DRAM system and SECDED type of error protection for x8 and x16 DRAM systems.

If the operation request received at the virtual memory manager 132 from the application 212 includes a selection of the medium-grained mode, the mode controller 202 uses the medium-grained mode logic 206 to implement a corresponding ECC and access granularity (e.g., to read and/or write to memory 112 using an error protection type and access granularity corresponding to the medium-grained mode). The medium-grained mode logic 206 of the illustrated example is provided with logic to use two memory channels in a lock-step mode to form a 128-bit wide memory channel to enable a 128B memory access. The medium-grained mode logic 206 of the illustrated example is also provided with logic to implement a double chipkill type of error protection for x4 DRAM systems, a chipkill type of error protection for x8 DRAM systems, and a DEC type of error protection for x16 DRAM systems.

If the operation request received at the virtual memory manager 132 from the application 212 includes a selection of the coarse-grained mode, the mode controller 202 uses the coarse-grained mode logic 208 to implement a corresponding ECC and access granularity (e.g., to read and/or write to memory 112 using an error protection type and access granularity corresponding to the coarse-grained mode). The coarse-grained mode logic 208 of the illustrated example is provided with logic to use four memory channels 118 in a lock-step mode to form a 256-bit wide memory channel to enable a 256B memory access. The coarse-grained mode logic 208 of the illustrated example is also provided with logic to implement a quad chipkill type of error protection for x4 DRAM systems, a double chipkill type of error protection for x8 DRAM systems, and a chipkill type of error protection for x16 DRAM systems.

In the illustrated example, to implement the different memory modes, the example mode controller 202 arranges data in the memory 112 using a data layout in the memory 112 that is compatible with all of the different memory modes to reduce or prevent overhead related to re-organizing the layout of data in the memory 112 each time a different memory mode is selected. In the illustrated example, having three memory modes (e.g., a 64B fine-grained mode, a 128B medium-grained mode, and a 256B coarse-grained mode), data is interleaved at the 256B boundary across all memory controllers, then the 64B data blocks are interleaved across all four 64-bit physical channels corresponding to the same memory controller 114. As data is interleaved in a similar manner for all of the memory modes, the data layout is not changed when switching between the different memory modes. When the memory mode is changed, the data layout remains the same and the ECC bits are re-generated.

The scheduler 210 of the illustrated example controls the scheduling of memory requests (e.g., requests to read and/or write to memory 112) having different access granularities. To schedule memory requests with different granularities, the scheduler 210 is configured to arbitrate between the different needs of the different memory modes. For example, data access requests for data stored using a coarse-grained mode (e.g., coarse-grained requests) use multiple memory channels in a lock-step manner to provide a larger access granularity such that none of the memory channels are available for other simultaneous access when the coarse-grained request is being serviced. In the illustrated example, coarse-grained requests are scheduled when multiple memory channels are available at the same time. In some examples, a coarse-grained request is not serviceable if all of the memory channels needed for the access granularity of the coarse-grained mode are not available, for example, due to a memory channel being used to service a fine-grained request. Since a coarse-grained request uses multiple memory channels, the coarse-grained request may be continuously deferred when multiple fine-grained requests are received. In some instances, servicing coarse-grained requests only after all fine-grained requests are serviced degrades system performance. To service coarse-grained requests in a more timely fashion, the scheduler 210 prioritizes coarse-grained requests so that they are not deferred for unduly long durations due to servicing fine-grained requests. When the scheduler 210 detects that a coarse-grained request has been deferred too long (e.g., its duration of deferment exceeds a threshold), the scheduler 210 increases the priority of the coarse-grained request so that fine-grained requests with a normal priority are not scheduled ahead of the coarse-grained request with the raised priority.

The mode controller 202 of the illustrated example may also enable switching between different memory modes (e.g., a fine-grained mode may be switched to a coarse-grained mode). In the illustrated example, to determine when to switch to a different memory mode, profilers 146 collect spatial locality information, memory channel and cache usage data, memory failure rates, etc. from the caches 106 and memory controller 114. An analyzer 214 of the operating system 134 of the illustrated example evaluates the collected data from the profilers 146 from time to time to determine that a different memory mode should be implemented. For example, the analyzer 214 may evaluate the data usage of the application 212. In such examples, if most data usage has a low spatial locality (e.g., associated data is stored across different non-contiguous 64 byte portions of the memory 112), then the analyzer 214 may determine that a fine-grained mode with a 64B cache line should be implemented. Alternatively, if most of the data usage has a high spatial locality (e.g., associated data is within contiguous byte portions of the memory 112), then a medium-grained mode with a 128B cache line or a coarse-grained mode may be implemented. The analyzer 214 may also analyze the memory bandwidth usage and/or availability and avoid implementing a coarse-grained mode where memory bandwidth availability is low. In some examples, the analyzer 214 evaluates a variety of results collected from the profilers 146 and assigns weights to the variety of results to determine whether a different memory mode should be selected and/or what memory mode should be selected.

In determining whether to switch between the memory modes, the analyzer 214 may also analyze the cost of switching between the memory modes because switching the access granularity and ECC used in one or more memory pages in the memory 112 involves re-determining ECCs, which moves a large amount of data within the memory 112. The cost of switching between memory modes may be low when, for example, the memory controller 114 is idle and power consumption is less of a concern. Where the memory controller 114 is not idle and/or power consumption is more of a concern, switching between memory modes may occur during a memory event such as a page migration or a system checkpointing event. During such memory events, reading and/or writing of data in the memory 112 occurs and, thus, switching to a different memory mode during these events incurs relatively little overhead for reconstructing the ECC. Once the analyzer 214 decides to switch the memory mode, the analyzer 214 may wait for such a memory event to occur. If such a memory event does not occur within a threshold period of time, the switching of the memory mode may be deferred, and a new determination of whether to switch the memory mode may be made based on newly collected data by the profilers 146. To switch the memory mode, the virtual memory manager 132 may propagate the new memory mode to the mode controller 202 by updating the page table entry 148. The mode controller 202 uses the ECC technique and access granularity for the new memory mode using the fine-grained mode logic 204, the medium-grained mode logic 206, and/or the coarse-grained mode logic 208 and implements the corresponding ECC technique and the corresponding access granularity at the memory 112.

The cache 106 of the illustrated example provides a multi-granularity cache hierarchy to implement memory modes specified or selected by the application 212. The cache 106 of the illustrated example enables a 64B cache line size for the fine-grained mode, a 128B cache line size for the medium-grained mode, and a 256B cache line size for the coarse-grained mode. For examples in which the application 212 specifies a medium or coarse-grained mode, the cache 106 receives 128B or wider of data and allocates two or more cache lines to a same set of associated cache lines. The cache 106 assigns a same tag (e.g., a tag 142) to all of the associated cache lines (e.g., two or more cache lines 136). The assigned tag 142 is stored at the cache 106, and a cache line vector 144 is associated with the assigned tag 142 to point to the cache lines 136 to which the tag 142 is assigned. In the illustrated example of FIG. 2, the cache lines 136 pointed to by the cache line vector 144 are logical sub-cache lines (e.g., 64B of data) within a larger cache line (e.g., 256B of data). In the illustrated example, tag selection bits 140 are indicative of a tag 142 assigned to a cache line 136 or a set of associated cache lines 136. Such identifications provided by tag selection bits 140 are useful when, for example, a cache line (e.g. a larger cache line such as a 256B cache line) is to be evicted.

The example apparatus 116 of FIG. 2 enable switching between different memory access granularities and different types of error protection techniques in a memory system. Selecting different memory error protection techniques (e.g., ECC techniques) and memory access granularities based on application behaviors and/or system memory utilization increases system performance, power efficiency, energy efficiency, and reliability.

While an example manner of implementing the apparatus 116 has been illustrated in FIG. 2, one or more of the elements, processes and/or devices illustrated in FIG. 2 may be combined, divided, re-arranged, omitted, eliminated and/or implemented in any other way. Further, the example mode controller 202, the example fine-grained mode logic 204, the example medium-grained mode logic 206, the example coarse-grained logic 208, the example scheduler 210, and/or, more generally, the example apparatus 116 of FIG. 2 may be implemented by hardware, software, firmware and/or any combination of hardware, software and/or firmware. Thus, for example, any of the example mode controller 202, the example fine-grained mode logic 204, the example medium-grained mode logic 206, the example coarse-grained logic 208, the example scheduler 210, and/or, more generally, the example apparatus 116 could be implemented by one or more circuit(s), programmable processor(s), application specific integrated circuit(s) (ASIC(s)), programmable logic device(s) (PLD(s)) and/or field programmable logic device(s) (FPLD(s)), etc. When any of the apparatus and/or system claims of this patent are read to cover a purely software and/or firmware implementation, at least one of the example mode controller 202, the example fine-grained mode logic 204, the example medium-grained mode logic 206, the example coarse-grained logic 208, and/or the example scheduler 210 is hereby expressly defined to include a tangible computer-readable storage medium such as a memory, DVD, CD, etc. storing the software and/or firmware. Further still, the example apparatus 116 illustrated in FIG. 2 may include one or more elements, processes and/or devices in addition to, or instead of, those illustrated in FIG. 2, and/or may include more than one of any or all of the illustrated elements, processes and devices.

Figure 3A:
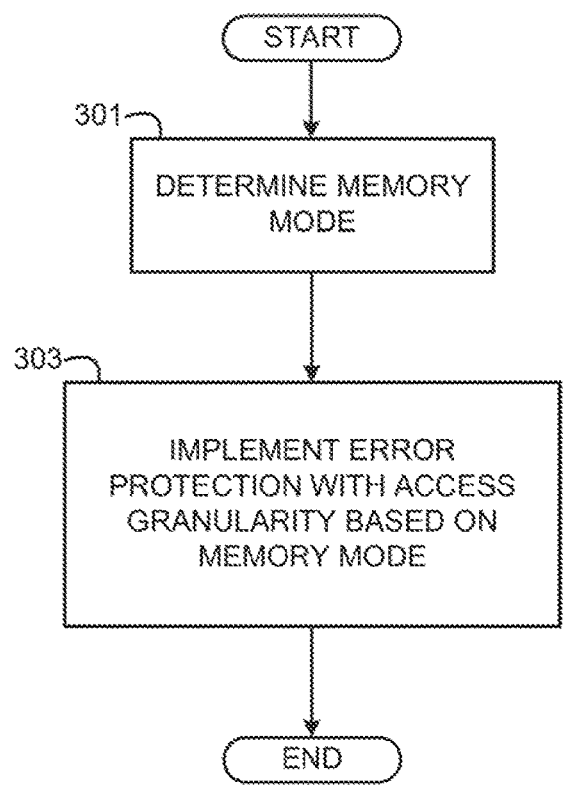
FIG. 3A is a flow diagram representative of example machine-readable instructions that can be executed to implement the example apparatus of FIG. 2 to determine and implement a selected memory mode.
Figure 3B:
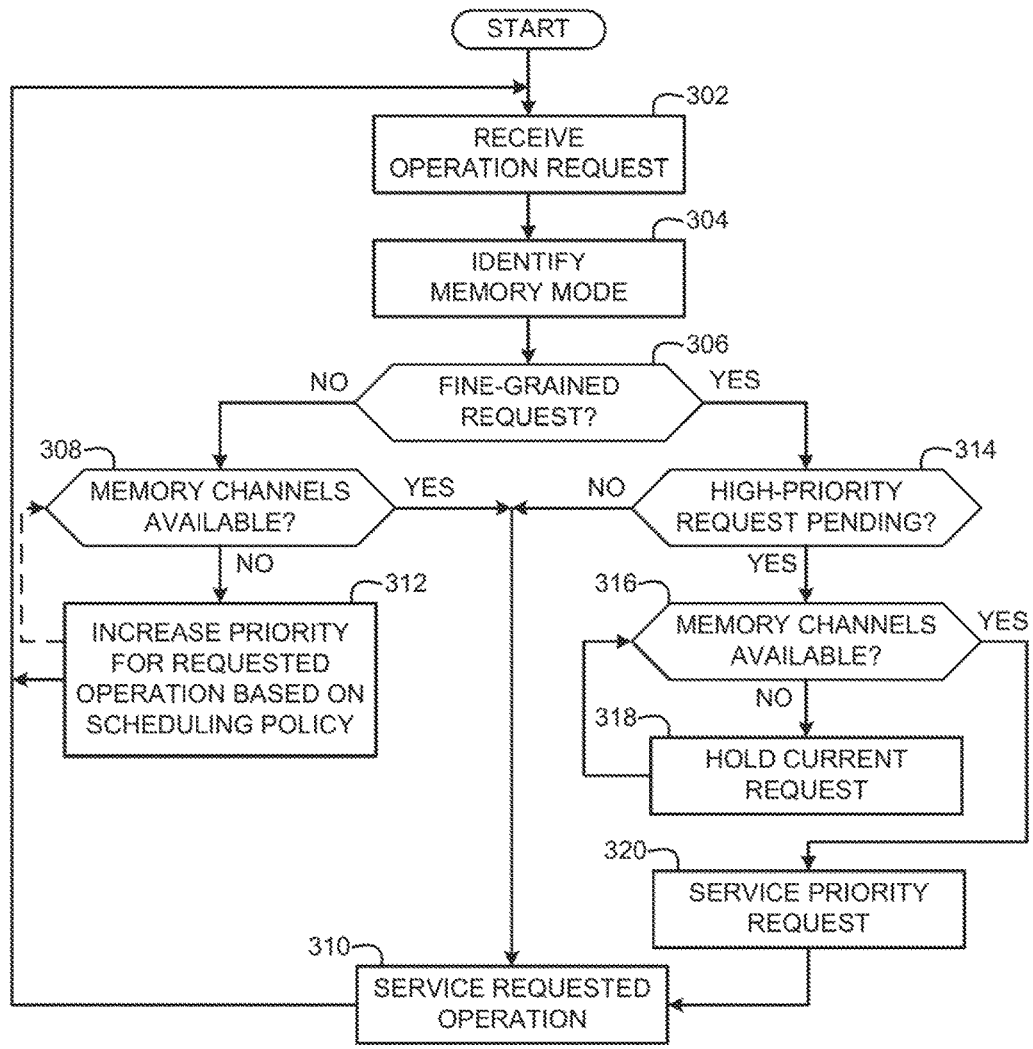
FIG. 3B is a flow diagram representative of example machine-readable instructions that may be executed to access memory using different memory modes.
Figure 4:
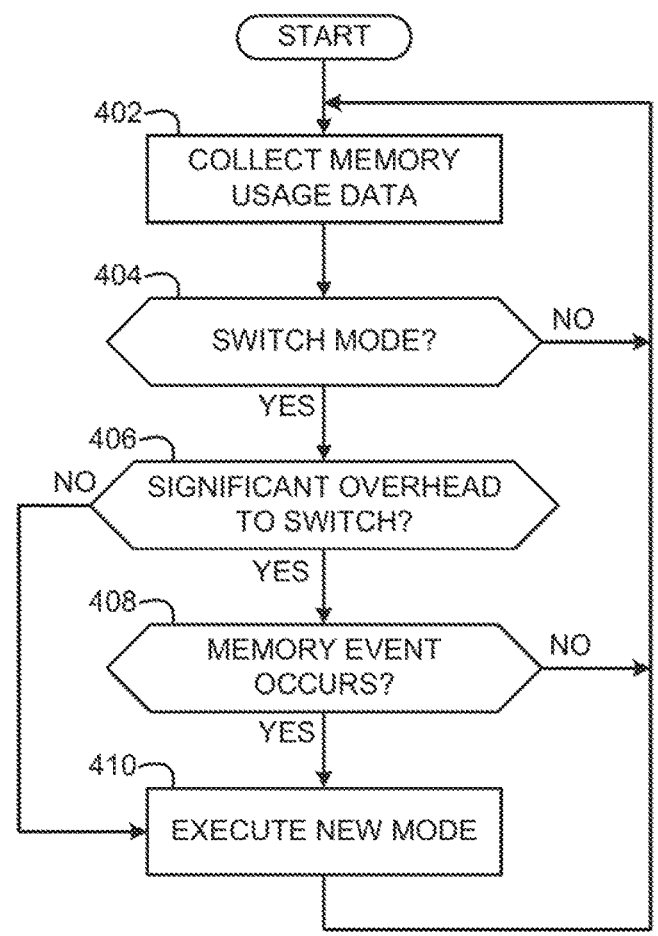
FIG. 4 is a flow diagram representative of example machine-readable instructions that can be executed to implement the example apparatus of FIG. 2 to switch between different memory modes.

Flowcharts representative of example machine-readable instructions for implementing the example apparatus 116 of FIG. 2 are shown in FIGS. 3A, 3B, and 4. In these examples, the machine-readable instructions comprise one or more programs for execution by one or more processors similar or identical to the processor 102 of FIG. 1B. The program(s) may be embodied in software stored on a tangible computer-readable storage medium such as a memory associated with the processor 102, but the entire program(s) and/or parts thereof could alternatively be executed by one or more devices other than the processor 102 and/or embodied in firmware or dedicated hardware. Further, although the example program(s) is/are described with reference to the flowcharts illustrated in FIGS. 3A, 3B, and 4, many other methods of implementing the example system 100 and/or the example apparatus 116 may alternatively be used. For example, the order of execution of the blocks may be changed, and/or some of the blocks described may be changed, eliminated, or combined.

As mentioned above, the example processes of FIGS. 3A, 3B, and/or 4 may be implemented using coded instructions (e.g., computer-readable instructions) stored on a tangible computer-readable storage medium (e.g., a storage device or storage disk) such as a hard disk drive, a flash memory, a read-only memory ("ROM"), a cache, a random-access memory ("RAM") and/or any other physical storage in which information is stored for any duration (e.g., for extended time periods, permanently, brief instances, for temporarily buffering, and/or for caching of the information). As used herein, the term tangible computer-readable storage medium is expressly defined to include any type of computer-readable storage device and/or storage disc and to exclude propagating signals. Additionally or alternatively, the example processes of FIGS. 3A, 3B, and/or 4 may be implemented using coded instructions e.g., computer-readable instructions) stored on a non-transitory computer-readable medium (e.g., a storage device or storage disk) such as a hard disk drive, a flash memory, a read-only memory, a cache, a random-access memory and/or any other storage media in which information is stored for any duration (e.g., for extended time periods, permanently, brief instances, for temporarily buffering, and/or for caching of the information). As used herein, the term non-transitory computer-readable medium is expressly defined to include any type of computer-readable medium and to exclude propagating signals. As used herein, when the phrase "at least" is used as the transition term in a preamble of a claim, it is open-ended in the same manner as the term "comprising" is open ended. Thus, a claim using "at least" as the transition term in its preamble may include elements in addition to those expressly recited in the claim.

FIG. 3A is a flow diagram representative of example machine-readable instructions that can be executed to implement the example memory controller 114 of FIG. 2 to determine and implement a selected memory mode. The memory controller 114 (FIG. 2) determines a selected memory mode to be used based on a request to access data in memory (block 301). The memory mode indicates that a memory page is to store a corresponding type of error protection information and is to be accessed using a corresponding memory access granularity. The memory controller 114 implements the error protection with the corresponding access granularity based on the memory mode (block 303) determined at block 301. For example, the memory controller 114 writes the corresponding type of error protection information (e.g., corresponding ECCs) and data to the memory page using a channel data width corresponding to the corresponding access granularity.

FIG. 36 is a flow diagram representative of machine-readable instructions to access memory using different memory modes. In the illustrated example, the virtual memory manager 132 (FIG. 2) receives an operation request (block 302). In the illustrated example, an operation request is a request to read data from and/or write data to the cache 106 (FIG. 2) and/or the memory 112 (FIG. 2). Operation requests include information specifying a particular memory mode such as a fine-grained mode, a medium-grained mode, or a coarse-grained mode. In the illustrated example, the application 212 selects the particular memory mode that provides a desirable performance based on access granularity and memory error protection.

The virtual memory manager 132 identifies the memory mode based on the memory operation request received from the application 212 (block 304) and communicates the memory mode to the mode controller 202 (FIG. 2) by updating the page table entry 148 (FIG. 2). If the operation request received from the application 212 specifies the fine-grained mode, the mode controller 202 is to implement the fine-grained mode logic 204 to generate the ECC information and to configure the access granularity to be used for the requested memory access. The fine-grained mode logic 204 of the illustrated example configures each of the memory channels 118 (FIG. 1B) as a 64-bit wide logical channel to enable a 64B memory access 126 (FIG. 1B). The fine-grained mode logic 204 of the illustrated example also implements logic to implement a chipkill-correct type of error protection for a x4 DRAM system and an SECDED type of error protection for x8 and x16 DRAM systems. If the operation request received from the application 212 specifies the medium-grained mode, the mode controller 202 is to implement the medium-grained mode logic 206 to generate the ECC information and to configure the access granularity to be used for the requested memory access. The medium-grained mode logic 206 of the illustrated example configures two of the memory channels 18 to operate in a lock-step mode to construct a 128-bit wide memory channel to enable a 128B memory access 128 (FIG. 1B). The medium-grained mode logic 206 of the illustrated example also implements a double chipkill type of error protection for x4 DRAM systems, a chipkill type of error protection for x8 DRAM systems, and/or a DEC type of error protection for x16 DRAM systems. If the operation request received from the application 212 specifies the coarse-grained mode, the mode controller 202 is to implement the coarse-grained mode logic 208 to generate the error protection information (e.g., ECC) and to configure the access granularity to be used for the requested memory access. The coarse-grained mode logic 208 of the illustrated example configures four of the memory channels 118 to operate in a lock-step mode to construct a 256-bit wide memory channel to enable a 256B memory access 130 (FIG. 1B). The coarse-grained mode logic 208 of the illustrated example also implements a quad chipkill type of error protection for x4 DRAM systems, a double chipkill type of error protection for x8 DRAM systems, and/or a chipkill type of error protection for x16 DRAM systems.

The scheduler 210 (FIG. 2) determines if the memory mode specified in the operation request is a fine-grained mode (block 306). If the specified memory mode is not a fine-grained mode (block 308), the scheduler 210 determines if a sufficient number of memory channels are available (block 308) to operate in a lock-step manner to implement a medium-grained mode or a coarse-grained mode. For example, a coarse-grained request may require four memory channels to operate in a lock-step manner and such memory channels may not be available when another memory operation is being implemented (e.g., a fine-grained request requiring a single memory channel). If a sufficient number of memory channels are available to operate in a lock-step manner to execute the requested memory operation (block 308), the mode controller 202 services the requested memory operation (block 310) using the selected error protection technique and access granularity. In the illustrated example, if a sufficient number of memory channels are not available to execute the requested memory operation (block 308), the scheduler 210 increases the priority for the requested memory operation based on a scheduling policy (block 312). In some examples, a scheduling policy may specify a duration of pendency threshold related to an amount of time for which requests are pending. For example, the scheduler 210 may increase the priority for the requested memory operation if the requested memory operation is not serviced within a threshold period of time (e.g., a timeout) defined by a scheduling policy. In some examples, durations of pendency for scheduling policies may be predetermined based on, for example, performance criteria, bandwidth criteria, power-consumption criteria, and/or any other suitable criteria. The increased priority of the request is used to cause the scheduler 210 to defer servicing fine-grained requests until the medium-grained or coarse-grained request is serviced, and to schedule the requested operation as soon as there are sufficient channels available to service the requested operation. After the requested operation is serviced (block 310) or the priority for the requested operation is raised (block 312), control then returns to block 302. In the illustrated example, while control returns to block 302 to await receipt of another operation request, the scheduler 210 also continues to monitor the high-priority request (shown in FIG. 3B by a dashed line) until sufficient memory channels are available to service the high-priority request.

Returning to block 306, if a fine-grained request is received, the scheduler 210 determines if there is a high-priority request pending (block 314). A high-priority request may be pending if a medium or coarse-grained request was unable to be serviced due to the unavailability of a sufficient number of memory channels to operate in lock-step mode. If a high-priority request is pending (block 314), the mode controller 202 determines if a sufficient number of memory channels are available to execute the pending high-priority request (block 316). If a sufficient number of memory channels are not available (block 316), the current request is put on hold (block 318) and control returns to block 316 to allow memory channels to become available to service the pending high-priority request. Once a sufficient number of memory channels are available to execute the pending high-priority request (block 316), the mode controller 202 executes the pending high-priority request (block 320) using the corresponding error protection technique and access granularity. The current operation request (e.g., a fine-grained request) is then serviced (block 310) by the mode controller 202 according to the corresponding error protection technique and access granularity. If a high-priority request is not pending (block 314), the mode controller 202 services the current operation request using the corresponding error protection technique and access granularity (block 310). After the pending priority request is serviced (block 320) and/or the current request is serviced (block 310), control returns to block 302.

FIG. 4 is a flow diagram representative of example machine-readable instructions that can be executed to implement the example system 200 of FIG. 2 to switch between different memory modes. Profilers 146 (FIG. 2) collect spatial locality information, memory channel and cache usage data, memory failure rates, etc. from the cache 106 (FIG. 2) and memory controller 114 (FIG. 2) (block 402). The analyzer 214 of the operating system 134 (FIG. 2) periodically evaluates the collected data from the profilers 146 to determine if a different memory mode should be implemented (block 404). In determining whether to switch the memory mode, the analyzer 214 evaluates the data usage of the application 212 (FIG. 2). In some examples, if most data usage has a low spatial locality (e.g., associated data is stored across multiple, non-contiguous 64 byte portions of the memory 112), the analyzer 214 determines that a fine-grained mode with a 64B cache line is to be implemented. Alternatively, if most of the data usage has a high spatial locality (e.g., associated data is stored in contiguous 64 byte portions of the memory 112), a medium-grained mode with a 128B cache line or a coarse-grained mode with a 256B cache line into be implemented. In some examples, the analyzer 214 also considers the memory bandwidth, and avoids implementing a coarse-grained mode where memory bandwidth (e.g., availability) is low. In some examples, the analyzer 214 evaluates a variety of results collected from the profilers 146 and assigns weights to the variety of results to determine whether to switch memory modes and/or what memory mode is to be implemented.

If the analyzer 214 determines that the memory mode should not be switched (block 404), control returns to block 402, at which the profilers 146 continue to collect memory usage data. If the analyzer 214 determines that the memory mode should be switched (block 404), the analyzer 214 determines if there is significant overhead (e.g., cost) to switch the memory mode. Switching a memory mode may be costly because switching the access granularity and the error protection information in the memory 112 (FIG. 2) requires redetermining ECCs or other error protection codes, which requires a large amount of data to be accessed. The cost of switching the memory mode may be low when, for example, the memory controller 114 is idle and power consumption is less of a concern. If the analyzer 214 determines that there is a significant overhead to switch the memory mode (block 406), the analyzer 214 determines if a memory event (e.g., a page migration or a system check-pointing event) is to occur (block 408). Switching between memory modes may occur during a memory event as reading and/or writing of data in the memory 112 occurs during such events and, thus, switching the memory mode during these events incurs less overhead for reconstructing the ECC. If a memory event is to occur within a threshold time period (block 408), to execute the new memory mode, the virtual memory manager 132 (FIG. 2) communicates the new memory mode to the mode controller 202 using the page table entry 148 (FIG. 2) and the mode controller 202 implements the new memory mode by servicing memory requests using a corresponding error protection technique and access granularity (block 410). If a memory event does not occur within a threshold time period (block 408), control returns to block 402 and the determination of whether to switch the memory mode is made based on newly collected data. If the analyzer 214 determines that there is not a significant overhead to switch the memory mode (block 406), the virtual memory manager 132 communicates the new memory mode to the mode controller 202 using the page table entry 148 and the mode controller 202 implements the new memory mode by servicing memory requests using a corresponding error protection technique and access granularity (block 410). Control then returns to block 402.

Although the above discloses example methods, apparatus, and articles of manufacture including, among other components, software executed on hardware, it should be noted that such methods, apparatus, and articles of manufacture are merely illustrative and should not be considered as limiting. For example, it is contemplated that any or all of these hardware and software components could be embodied exclusively in hardware, exclusively in software, exclusively in firmware, or in any combination of hardware, software, and/or firmware. Accordingly, while the above describes example methods, apparatus, and articles of manufacture, the examples provided are not the only way to implement such methods, apparatus, and articles of manufacture.

Although certain methods, apparatus, systems, and/or articles of manufacture have been described herein, the scope of coverage of this patent is not limited thereto. On the contrary, this patent covers all methods, apparatus, and articles of manufacture fairly failing within the scope of the appended claims either literally or under the doctrine of equivalents.

What is claimed:

1. An apparatus, comprising:
a memory controller implemented in hardware and controlling a physical memory to:
determine a selected memory mode based on a request, the memory mode to indicate that a memory page in the physical memory is to store a corresponding type of error protection information and is to store data for retrieval using a corresponding access granularity selected from a set of at least two available access granularities, the corresponding access granularity being application dependent, wherein each access granularity of the at least two available access granularities corresponds to a different amount of data that is accessed during a single access operation in accordance with one or more memory channels, each having a data channel width associated with one or more ranks of the physical memory; and
store the data and the error protection information in the memory page for retrieval using the corresponding access granularity,
wherein the memory mode is selected by an operating system or an application executing on the operating system, and
wherein a cache including a plurality of cache lines is in communication with the memory controller and stores portions of the data of the memory page based on the corresponding access granularity.

2. The apparatus of claim 1, wherein the request is at least one of a request to read from the memory page or a request to write to the memory page, the request received from an application.

3. The apparatus of claim 1, wherein the error protection information is an error correcting code.

4. The apparatus of claim 1, wherein the memory controller is to identify a second memory mode based on a second request, the second memory mode to indicate that a second memory page is to store a second type of error protection information and is to store data for retrieval using a second access granularity.

5. The apparatus of claim 4, wherein the second type of error protection information provides stronger error resiliency than the type of error protection information and the second access granularity corresponds to a wider data channel than the access granularity.

6. The apparatus of claim 4, wherein the memory controller configures a plurality of the memory channels to operate in lock-step to implement the second access granularity.

7. The apparatus of claim 1, wherein the request includes information specifying the memory mode.

8. The apparatus of claim 1, wherein the memory mode is selected based on operating conditions of the memory controller.

9. The apparatus of claim 1, wherein the selected memory mode ranges between large-granularity memory access with strong memory protection and small-granularity memory access with less strong memory protection.

10. The apparatus of claim 1, wherein the memory mode is switchable between fine-grained modes and coarse-grained modes.

11. A system, comprising:
a memory manager to receive a selected memory mode in a request from an operating system or an application executing on the operating system, the memory mode to indicate that a memory page in a physical memory is to store a corresponding type of error protection information and is to store data for retrieval using a corresponding access granularity, the corresponding access granularity being selected from at least two available access granularities and being application dependent, wherein each access granularity of the at least two available access granularities corresponds to a different amount of data that is accessed during a single access operation in accordance with one or more memory channels, each having a data width associated with one or more ranks of the physical memory;
a memory controller implemented in hardware and controlling the physical memory to store the data and the error protection information in the memory page for retrieval using the corresponding and application dependent access granularity; and
a cache including a plurality of cache lines to store portions of the data of the memory page based on the corresponding and application dependent access granularity.

12. The system of claim 11, wherein the cache is to assign a tag to the plurality of cache lines storing the portions of the data.

13. The system of claim 12, wherein the tag is associated with a vector to point to the plurality of cache lines storing the portions of the data.

14. The system of claim 11, wherein the plurality of cache lines are combined to form a cache sector.

15. The system of claim 11, wherein the memory controller is to generate the error protection information that corresponds to the memory mode.

16. The system of claim 11, wherein the request is at least one of a request to allocate a memory page, a request to read from the memory page or a request to write to the memory page.

17. A computer-implemented method, comprising:
determining, by a memory controller implemented in hardware and controlling a physical memory, a selected memory mode based on a request to access data in memory, the memory mode to indicate that a memory page in the physical memory is to store a corresponding type of error protection information and is to store data for retrieval using a corresponding access granularity selected from a set of at least two available access granularities, the corresponding access granularity being application dependent, wherein each access granularity of the at least two available access granularities corresponds to a different amount of data that is accessed during a single access operation in accordance with one or more memory channels, each having a channel data width associated with one or more ranks of the physical memory;
storing, by the memory controller, the data and the error protection information in the memory page for retrieval using the corresponding access granularity; and
storing, by a cache including a plurality of cache lines, portions of the data of the memory page based on the corresponding access granularity,
wherein the memory mode is selected by an operating system or an application executing on the operating system.

18. The method of claim 17, further comprising:
determining a second memory mode to be implemented at the memory page based on memory performance, the second memory mode to indicate that the memory page is to store a second type of error protection information and is to store data for retrieval using a second access granularity, wherein the second type of error protection information is an error correcting code; and storing the second type of error protection information and data to the memory page using a second channel data width corresponding to the second access granularity, wherein the second channel data width is twice the channel data width.

19. The method of claim 17, further comprising:

assigning, by the cache, a tag to the plurality of cache lines storing the portions of the data, wherein the tag is associated with a vector to point to the plurality of cache lines storing the portions of the data.

* * * * *